United States Patent [19]
Teo

[11] Patent Number: 5,970,374
[45] Date of Patent: Oct. 19, 1999

[54] METHOD FOR FORMING CONTACTS AND VIAS WITH IMPROVED BARRIER METAL STEP-COVERAGE

[75] Inventor: Yeow Meng Teo, Singapore, Singapore

[73] Assignee: Chartered Semiconductor Manufacturing Ltd., Singapore, Singapore

[21] Appl. No.: 08/734,065

[22] Filed: Oct. 18, 1996

[51] Int. Cl.$^6$ .................. H01L 21/311; H01L 21/461
[52] U.S. Cl. .................. 438/629; 438/632; 438/633; 438/637; 438/643; 438/644; 438/645; 438/656; 438/672
[58] Field of Search .................. 438/622, 625–629, 438/631–633, 643–646, 653, 654, 656, 679, 672, 637

[56] References Cited

U.S. PATENT DOCUMENTS

| | | | |
|---|---|---|---|
| 4,960,732 | 10/1990 | Dixit et al. | 437/192 |
| 5,387,550 | 2/1995 | Cheffings et al. | 437/189 |
| 5,391,517 | 2/1995 | Gelatos et al. | 438/643 |
| 5,420,070 | 5/1995 | Matsuura et al. | 437/190 |
| 5,462,895 | 10/1995 | Chen | 437/200 |
| 5,470,792 | 11/1995 | Yamada | 437/155 |
| 5,516,729 | 5/1996 | Dawson et al. | 438/623 |
| 5,654,234 | 8/1997 | Shih et al. | 438/643 |
| 5,658,829 | 8/1997 | Matthews et al. | 438/656 |
| 5,698,467 | 12/1997 | Sakao et al. | 438/692 |
| 5,739,047 | 4/1998 | Chiang | 438/653 |
| 5,747,382 | 5/1998 | Huang et al. | 438/624 |

OTHER PUBLICATIONS

S. Wolf et al, "Silicon Processing For The VLSI Era" Lattice Press, Sunset Beach, CA, p. 368.

*Primary Examiner*—John F. Niebling
*Assistant Examiner*—Ha Tran Nguyen
*Attorney, Agent, or Firm*—George O. Saile; Rosemary L. S. Pike

[57] ABSTRACT

A method is described for overcoming the non-conformity and poor step coverage incurred when materials such as metals and barrier materials are deposited into contact or via openings by physical-vapor-deposition (PVD) techniques such as sputtering and evaporation. Conventional PVD deposition into a vertical walled opening results in the formations of cusps along the walls at the mouth of the opening. These cusps obstruct the material stream into the depth of the opening, resulting in inadequate coverage at the base of the opening particularly at the corners. This increases the chance of failure of the barrier material resulting in a reliability exposure. In addition, the cusps, if not removed, cause the formation of voids in subsequently deposited conductive plugs. The invention teaches the insulative layer, wherein the openings are formed, to be deposited to a greater thickness than required by the design. The openings are then formed and filled with a spin-on-glass. The insulative layer is then polished to the design thickness, removing the cusps. The spin-on-glass, which protects the openings from damage and contamination during polishing, is removed and an adhesion layer is applied prior to the deposition of the conductive material of the contact or via.

34 Claims, 10 Drawing Sheets

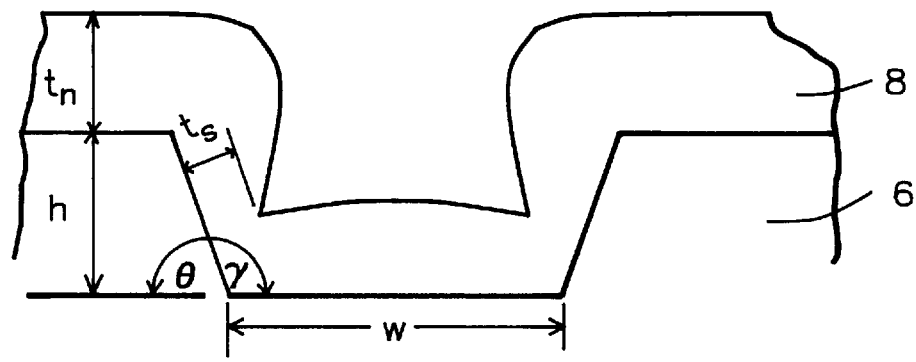
FIG. 1 – Prior Art
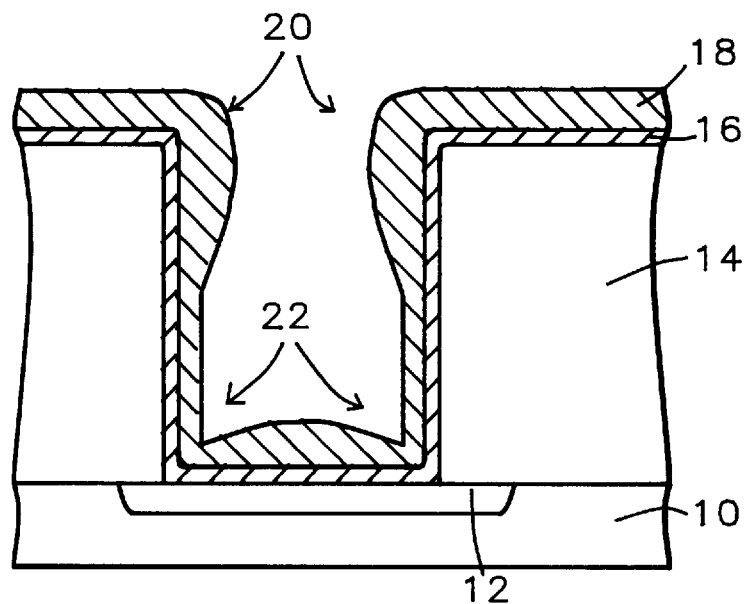
FIG. 2A – Prior Art

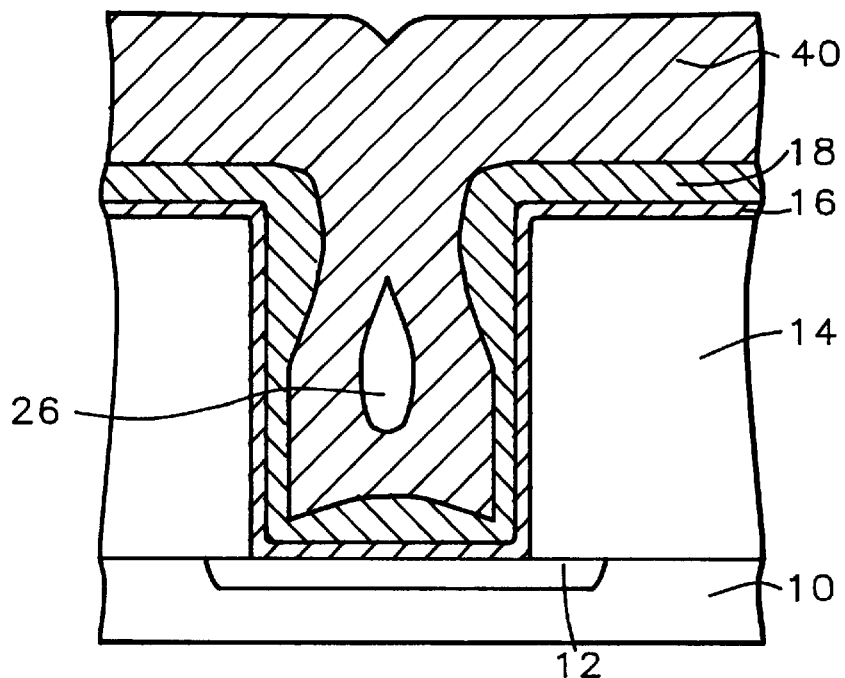
FIG. 2B – Prior Art
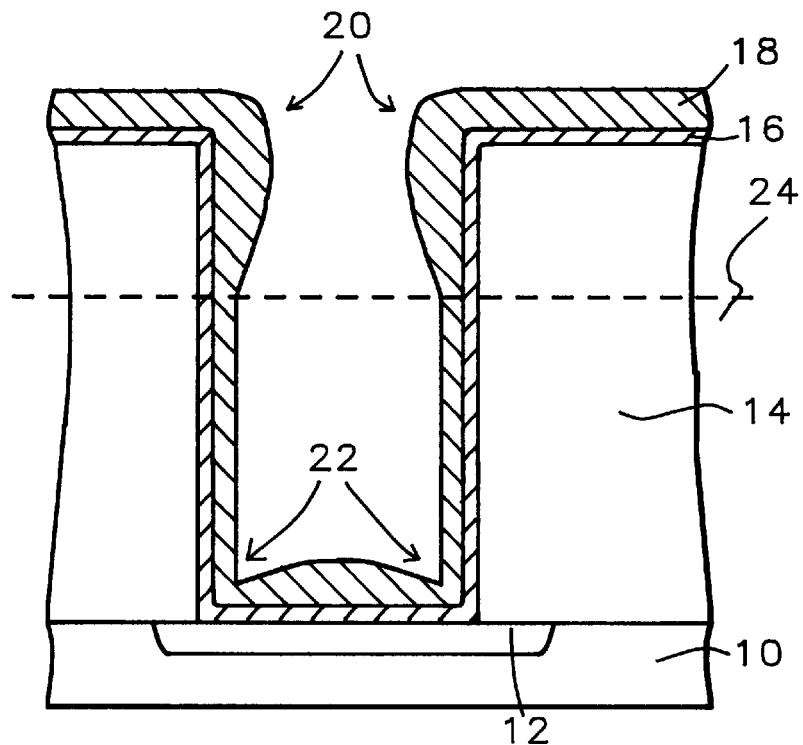
FIG. 3A

1

METHOD FOR FORMING CONTACTS AND VIAS WITH IMPROVED BARRIER METAL STEP-COVERAGE

BACKGROUND OF THE INVENTION (1) Field of the Invention

The invention relates to processes for the manufacture of semiconductor devices and more particularly to processes for forming metal contacts and Vias.

(2) Description of Prior Art

The use of tungsten in the fabricating of very-large-scale-integrated (VLSI) circuits has been practiced since the mid 1980s. As a conductive material tungsten does not rank as high as aluminum, which has been the primary conductor used in micro-circuit chip technology for nearly forty years. On the other hand, tungsten provides many features which make it an important material for fabricating metal-to-silicon contacts as well as via plugs for making inter-level metal connections. In this capacity tungsten is deposited into contact or via openings, and anisotropically etched to the insulating layer, leaving tungsten in the openings.

Chemical-vapor-deposited (CVD) tungsten has proven to be an excellent material for such interconnect applications because of its low resistance, low stress (less than $5\times10^9$ dynes/cm$^2$), and a coefficient of thermal expansion which closely matches that of silicon. In addition tungsten has a high resistance to electromigration which is a common problem with aluminum its alloys. CVD tungsten can be deposited at temperatures around 400° C. with good conformity and step coverage.

Although tungsten does not bond well to either silicon or to the adjacent silica based insulating layer, a thin layer (less than 1,000 Angstroms) of titanium (Ti) is often used as a bonding agent to the silicon. Dixit et.al. U.S. Pat. No. 4,960,732 describe the formation of a tungsten plug contact utilizing Ti as a bonding agent, followed by a layer of titanium nitride (TiN) which acts as a diffusion barrier to prevent dopants from passing from the silicon as well as spiking of metal into the silicon. The Ti layer, when thermally annealed, fuses with the silicon to form titanium silicide (TiSi$_2$) and with the silica based insulating layer to form a titanium silicate (Ti$_x$SiO$_y$). Adhesion of the TiN to the Ti and subsequently to the tungsten is considered excellent.

The Ti-TiN-W composite tungsten plug metallurgy has been widely accepted and various techniques for its formation have been described. In the earliest teachings such as those of Dixit et.al., the Ti an TiN layers were deposited by sputtering, although CVD is also claimed. The sputtering can be accomplished by first sputtering a titanium target with argon to form the Ti layer and then admitting nitrogen, thereby sputtering reactively, to form the TiN layer. Alternatively, a multi-target sputtering tool can be used having a Ti target and a TiN target so that the layers may be deposited during a single evacuation cycle by switching targets within the tool. Successive deposition of the Ti and the TiN layers during a single pumpdown is desirable because exposure of the Ti layer to atmosphere will immediately result in the formation of a native oxide layer which can compromise the resistivity of the contact if not removed prior to the deposition of the TiN.

The good conformity and step coverage afforded by tungsten is due in large part to the nature of the deposition process itself. In the CVD process, particularly with low-pressure-chemical-vapor-deposition (LPCVD), the chemical reaction which forms the product occurs at the heated surface of the material receiving the deposition. Physical-vapor-deposition (PVD) processes such as evaporation or sputtering, on the other hand, cannot provide such conformity and edge coverage because the material being deposited arrives from discrete regions distant from its final location. This lends directionality to the process and consequently those regions of a receiving substrate which face the source of the particle stream receive a greater amount of deposit than those topological features not normal to the particle stream.

A computer simulation of film deposition by dc magnetron sputtering into an opening similar to that used for integrated circuit contacts is shown in FIG. 1 (adapted from S. Wolf and R. N. Tauber, "Silicon Processing for the VLSI Era", Vol.I, Lattice Press, Long Beach, Calif., (1986) p.368). A layer of material 8 of nominal thickness $t_n$ is sputter deposited onto a substrate material 6 having an opening with base w and height h. The step coverage is defined by the minimum thickness of the film $t_s$ divided by its nominal thickness $t_n$ expressed in percent. In this example the opening has a taper expressed by the angle 90-θ which favors better step coverage than the vertical walled contact openings under consideration here.

The minimum thickness in the contact openings occurs near the base as is also shown in FIG. 2A. Openings with a high aspect ratio h÷w (FIG. 1) can have insufficient coverage along the base corners of the opening. Step coverage can be improved to some extent by heating of the wafer. This allows surface migration of the depositing species to occur, thereby improving conformity.

Consequently the sputtering processes for the deposition of Ti and TiN have the shortcomings of poor step coverage. This is illustrated in a prior art cross section of a contact opening shown in FIG. 2A. A semiconductor wafer 10, having an active area diffusion 12 has an insulating layer 14 into which an opening 15 has been made and a thin layer of Ti 16 followed by a thicker layer of TiN 18 have been deposited by sputtering. Inadequate step coverage causes cusps 20 to form at the entrance of the opening 15. A subsequently deposited tungsten layer, which is postured to fill the opening 15, prematurely pinches off before the lower portion of the opening 15 is filled. The result is a void 26 shown in FIG. 2B. When the tungsten layer is etched back into the insulating layer 14, completing the formation of the tungsten plug contact, the void 26 may be exposed creating a potential reliability defect. Exposed voids are highly susceptible to absorption of moisture or other corrosive contaminants.

Chen U.S. Pat. No. 5,462,895 also points out this step coverage shortcoming but does not indicate the occurrence of voids in the tungsten. However, such voids have been observed by scanning-electron-microscopy (SEM). They have also been encountered by Cheffings et.al. U.S. Pat. No. 5,387,550 who, rather than seeking to avoid them, treats them after-the-fact by over-etching the tungsten plug into the void and filling the void and the top of the opening with polysilicon. In doing so they also etch deeply into the TiN along the walls of the contact openings.

Chen resolved the edge coverage problem by using CVD for the deposition of the Ti and TiN layers, thereby achieving better conformity. However, because of thermal budget, availability, and other processing restraints, CVD is not always a viable option.

Yamada U.S. Pat. No. 5,470,792 and Matsuura U.S. Pat. No. 5,420,070 disclose methods for the formation of Ti and TiN layers within contact and via openings where tungsten plugs are used. They do not, however, disclose the use of chemical-mechanical-polishing (CMP) in combination with spin-on-glass (SOG) to form improved contacts or vias as is disclosed by this invention.

For applications where aluminum metallization is applied into the openings, whether contacts or vias, similar problems are encountered. Referring again to FIG. 2A, coverage of TiN in the vicinity of the base corners 22 of the opening 15 can be precariously thin so as to place the barrier functionality of the layer at risk. When contacts are involved, inadequate barrier function is known to cause aluminum migration leading to junction spiking.

SUMMARY OF THE INVENTION

Accordingly, it is a purpose of this invention to provide a method for forming void-free, low resistance tungsten plug contacts and vias within openings having a Ti-TiN metallurgy deposited by PVD techniques such as sputtering.

It is also an object of this invention to provide a method for forming void-free, low resistance aluminum contacts and vias within openings having a Ti metallurgy deposited by PVD techniques such as sputtering. Aluminum or aluminum alloys in these applications may be deposited using metal-organic-chemical-vapor-deposition (MOCVD) techniques.

It is a further purpose of this invention to provide a method to remove cusps or encroaching overhangs of material at the tops of openings having high aspect ratios.

The method utilizes an initial insulating layer deposited thicker than the final design thickness. After forming the contact openings, a Ti/TiW or Ti/TiN barrier/glue layer is sputter deposited and spin-on-glass is deposited to partially fill the contact openings. The layer is next thinned to design thickness by chemical-mechanical-polishing (CMP). This polishing procedure removes the encroaching cusps as well as the barrier/glue layer on the upper surface. After removal of the SOG, a second layer of Ti or Ti/TiN is deposited to cover the surface and tungsten is next deposited in customary fashion.

BRIEF DESCRIPTION OF THE DRAWINGS

FIG. 1 is a cross section of a layer of material deposited into an opening by dc magnetron sputtering as calculated by a computer simulation.

FIG. 2A and FIG. 2B are cross sections of the steps of a prior art process for forming tungsten plug contact with sputtered Ti-TiN barrier metallurgy.

FIG. 3A through FIG. 3F are cross sections of the steps of the process for forming a tungsten plug contact with sputtered Ti-TiN metallurgy as taught by a first embodiment of this invention.

DESCRIPTION OF THE PREFERRED EMBODIMENTS

Figure 3B:
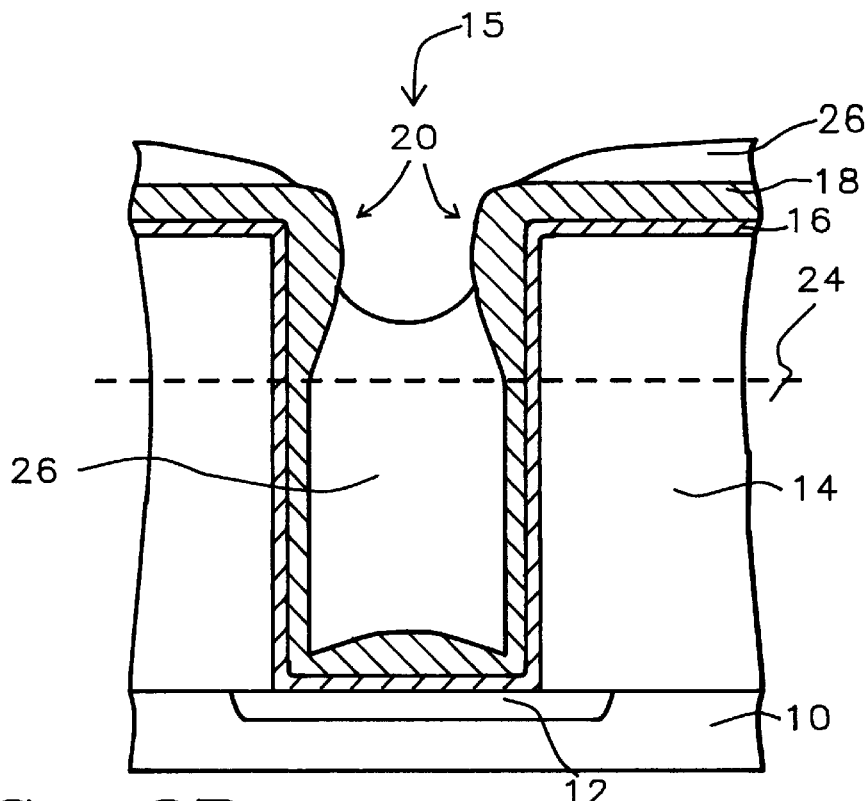

In a first embodiment of this invention the formation of a contact is accomplished and the reader is referred to the cross section shown in FIG. 3A. A p-doped <100> oriented monocrystalline silicon wafer 10 is provided. Using standard processing techniques familiar to those in the integrated circuit manufacturing industry, semiconductor devices such as self-aligned polysilicon gate field-effect-transistors, are formed within the surface of the silicon wafer. The heavily doped source and drain implants of arsenic or phosphorous 12 comprise the active areas of these devices to which metallic contacts are to be formed.

At the point of insertion of this invention a insulating layer of borophosphosilicate glass (BPSG) 14 between 1.0 and 1.5 microns thick has been deposited onto the silicon surface and contact opening 15 has been patterned and etched into it using reactive-ion-etching (RIE). The initial thickness of the BPSG layer is between about 25% and 35% greater than its final design thickness which is represented in the figure by the dashed line 24. The photoresist mask used to pattern the contact opening 15 is next removed by oxygen plasma ashing and wafer is given a dip etch in hydrofluoric acid (HF) diluted approximately 50:1 with water to remove any native silicon oxide film in the contact opening 15.

A layer of Ti 16 between 400 and 800 Angstroms thick and a layer of TiW 18 between 1,500 and 2,500 Angstroms thick are deposited over the wafer by sputtering. The two layers are deposited sequentially, without breaking vacuum, in a multi-target sputtering tool having a Ti target and a TiW target utilizing argon. Rapid-thermal-annealing (RTA) in nitrogen at about 670° C. for about 30 seconds activates the carriers in the silicon and forms a strong chemical bond to the Ti.

The cusps 20 develop in the upper portion of the contact opening 15 and as they grow during the deposition, the ability of material to cover the lower portions of the opening 15 is further impaired. The lower corners 22 of the opening 15 are particularly vulnerable to inadequate coverage and present a risk of barrier failure.

Referring next to FIG. 3B, a spin-on-glass (SOG) 26, is applied using a commercial wafer spinning apparatus with an adjustable spin rate and a dispensing nozzle located above the wafer center. The application procedure consists of applying the SOG solution at a pre-determined spin rate; removing the wafer and placing it to bake successively on three hot plates set at 100° C., 160° C. and 250° C. for about one minute on each. This procedure gradually drives out the solvent and performs a partial curing. A single coat consisting of about 4,000 to 6,000 Angstroms of SOG is applied.

As is illustrated in FIG. 3B, The SOG 26 fills in the contact opening 15 to a level which is above the dashed line 24 representing the final design thickness of the insulating layer 14. The SOG provides protection of the opening 15 and its barrier metal lining from damage and contamination during subsequent CMP processing.

Next the wafer undergoes CMP which removes the upper portion of material until the dashed line 24 is reached. CMP is a procedure that has become well known in the art and will therefore not be discussed in detail here. Determination of endpoint for the CMP may be accomplished by monitoring the thickness of the insulating layer 14 during polishing although, by proper calibration, a timed CMP can achieve the target thickness to an acceptable measure. The cusps 20 which encroach into the opening 15 are effectively removed by the CMP.

Figure 3C:
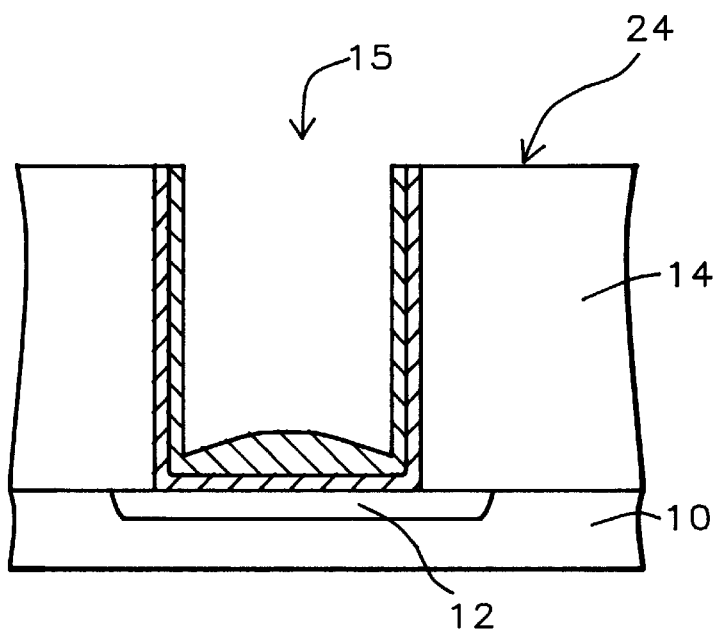

After polishing, the residual SOG is removed from the opening 15 by dipping the wafer into 50:1 to 100:1 dilute HF for about 20 to 30 seconds. FIG. 3C shows the contact opening at this juncture. The insulating layer 14 is a t its final design thickness 24 and the opening 15 is un-obstructed.

Figure 3D:
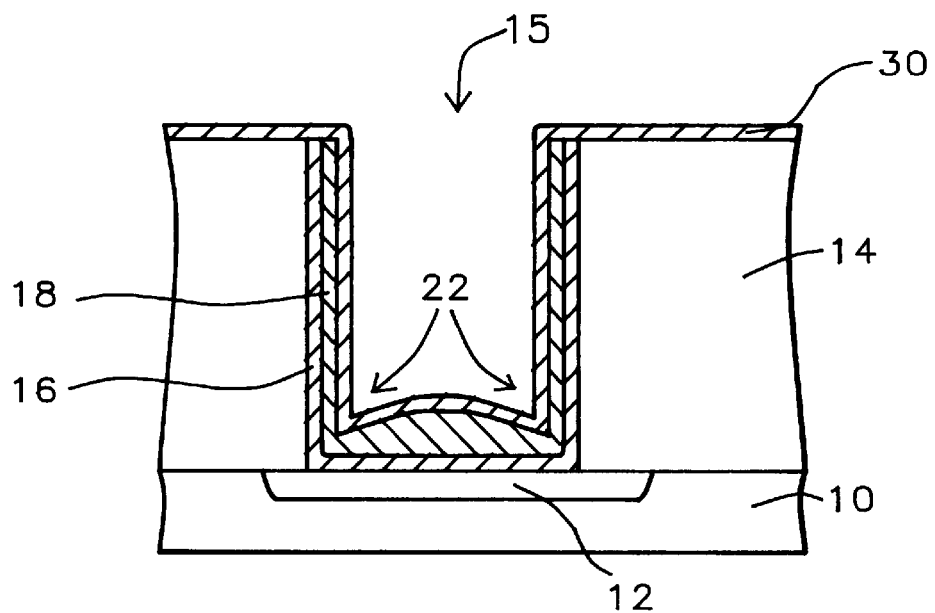

Referring next to FIG. 3D, a Ti/TiN barrier/glue layer 30 is next deposited over the wafer by sputtering. This layer forms an additional coating within the opening 15 and re-enforces the lower corners 22 of the opening 15 and thereby reduces the risk of barrier failure. If tungsten plugs are to be used the glue layer comprises Ti/TiN.

Figure 3E:
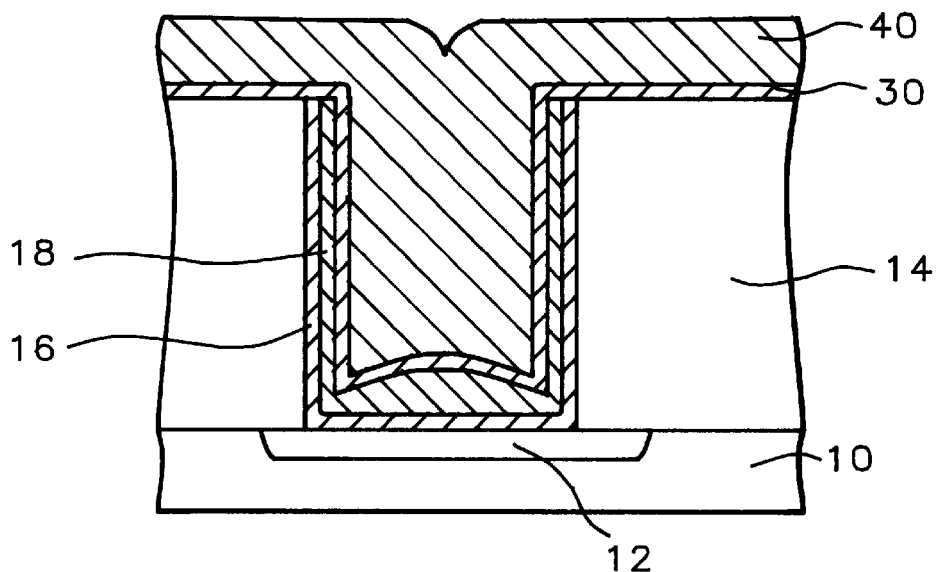

Referring now to FIG. 3E, a layer of tungsten 40 nominally between 3,000 and 5,000 Angstroms thick is deposited over the wafer by LPCVD at a temperature of between about 450° C. and 550° C. using tungsten hexafluoride ($WF_6$) with silane and with hydrogen. The deposition is carried out in a cold-walled, low temperature LPCVD reactor.

Figure 3F:
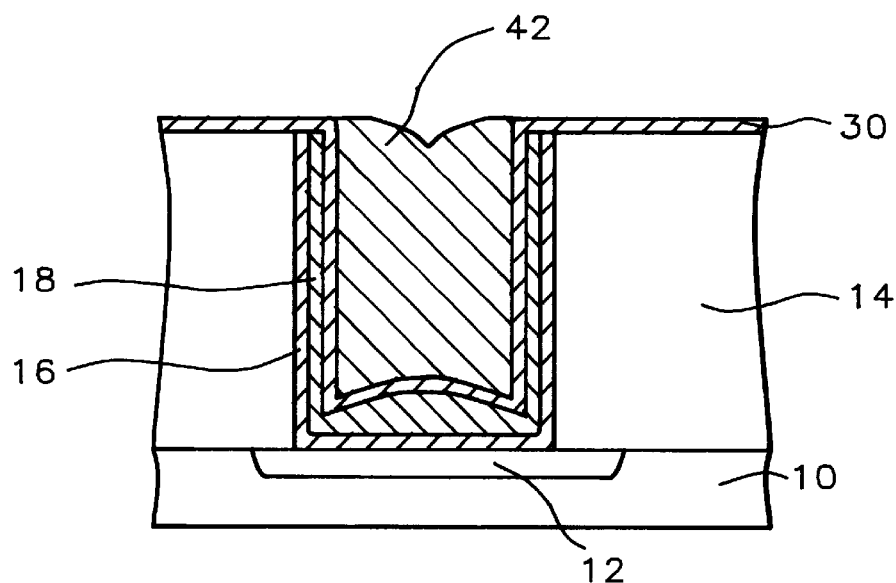

Because the walls of the contact opening 15 have been rendered essentially vertical by the removal of the cusps, the tungsten deposition fills the contact opening without leaving voids. The tungsten layer 40 is patterned with photoresist in the conventional manner and etched back to the glass insulating layer 14 to define the completed tungsten plug 42 shown in cross section in FIG. 3F.

The tungsten plugs are subsequently contacted by the preferred interconnection metallurgy, which typically consists of an aluminum alloy, deposited and patterned on the surface of the insulating layer.

A second embodiment of this invention deals with the formation of vias. Vias, unlike a contacts, generally do not require the special precautions taken to form stable ohmic contacts to silicon. In addition, via openings generally do not have the minimal size restrictions of contacts. Although, in their earliest utilization, tungsten plugs were applied only to contacts, they have recently become preferred for via connections as well. Tungsten plugs as described in the first embodiment can also be utilized for the formation of via connections between metallization layers.

The second embodiment describes a met hod for the formation of vias using tungsten plugs. A p-doped <100> oriented monocrystalline silicon wafer 10 is provided. Using standard processing techniques familiar to those in the integrated circuit manufacturing industry, semiconductor devices such as self-aligned polysilicon gate field-effect-transistors, are formed within the surface of the silicon wafer. Contacts are formed to the silicon devices and.

At the point of insertion of this embodiment, any polysilicon levels are in place and a at least one level of interconnection metallization 54 has been deposited and patterned. The layer 52 represents a plurality of structural components layered beneath a metal layer 54. These comprise polysilicon levels which form components of MOS field-effect-transistors and their local interconnects. An insulative layer 56 of BPSG between about 1.0 and 1.5 microns thick is deposited over the metallization. The thickness of this layer, as deposited, is about 30% thicker than the final design thickness of the insulative layer. The final design thickness of the layer 56 is represented by the dashed line 58.

A via 60 is patterned with photoresist and formed by anisotropic etching, for example by RIE. After removal of the photoresist, a layer of Ti 62 between 400 and 800 Angstroms thick and a layer of TiW 64 between 1,500 and 2,500 Angstroms thick are deposited over the wafer by sputtering. The two layers are deposited sequentially, without breaking vacuum, in a multi-target sputtering tool having a Ti target and a TiW target utilizing argon.

As in the first embodiment, cusps 20 develop in the upper portion of the contact opening 60 and as they grow during the deposition, the ability of material to cover the lower portions of the opening 60 is further impaired. The lower corners 22 of the opening 60 are particularly vulnerable to inadequate coverage and present a risk of barrier failure.

Figure 4A:
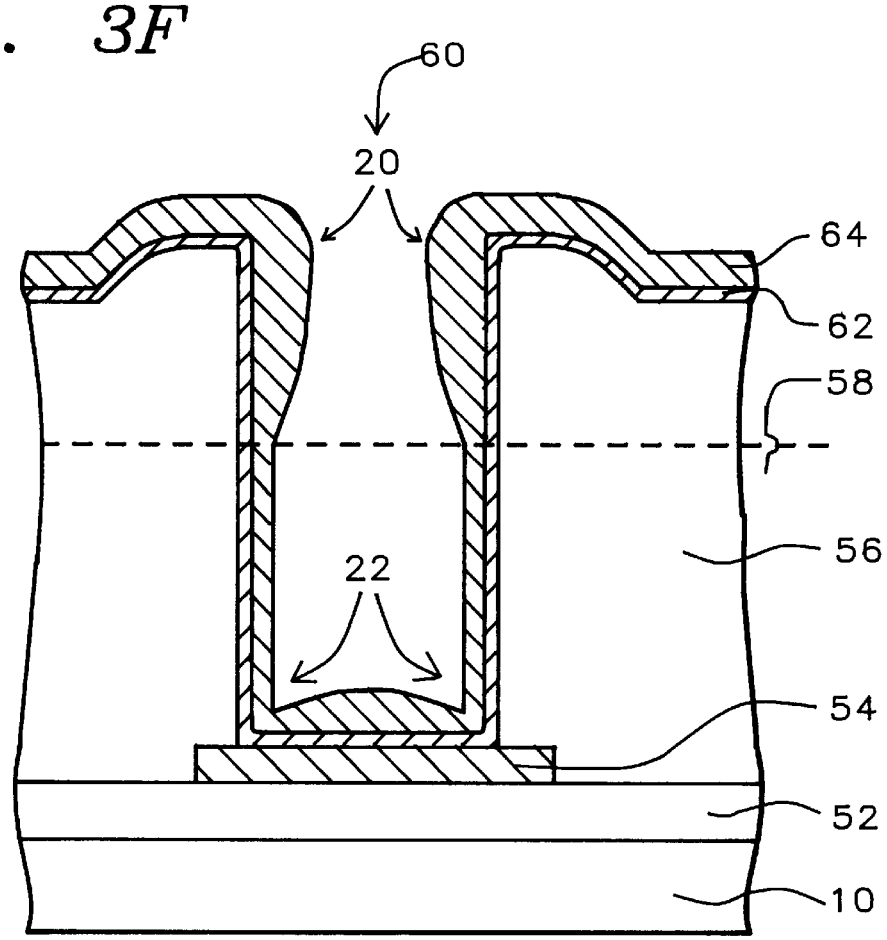
FIG. 4A through FIG. 4D are cross sections illustrating a second embodiment of this invention.
Figure 4B:
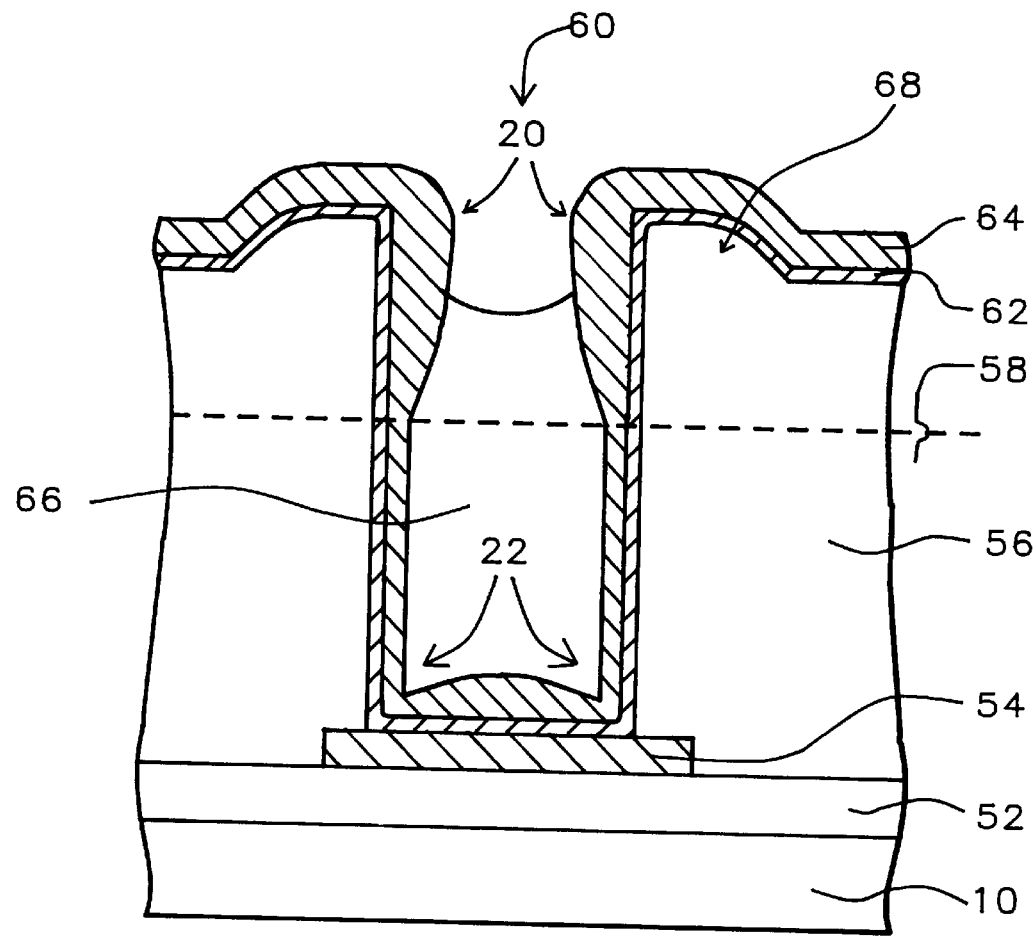

Referring next to FIG. 4B, a spin-on-glass (SOG) 66, is applied using a commercial wafer spinning apparatus with an adjustable spin rate and a dispensing nozzle located above the wafer center. The application procedure consists of applying the SOG solution at a pre-determined spin rate; removing the wafer and placing it to bake successively on three hot plates set at 100° C., 160° C. and 250° C. for about one minute on each. This procedure gradually drives out the solvent and performs a partial curing. A single coat consisting of about 4,000 to 6,000 Angstroms of SOG is applied.

As is illustrated in FIG. 4B, The SOG 66 fills in the contact opening 60 to a level which is above the dashed line 58 representing the final design thickness of the insulating layer 56. The SOG provides protection of the opening 60 and its metal lining from damage and contamination during subsequent CMP processing.

Next the wafer undergoes CMP which removes the upper portion of material until the dashed line 58 is reached. CMP is a procedure that has become well known in the art and will therefore not be discussed in detail here. Determination of endpoint for the CMP may be accomplished by monitoring the thickness of the insulating layer 56 during polishing although, by proper calibration, a timed CMP can achieve the target thickness to an acceptable measure. The cusps 20 which encroach into the opening 60 are effectively removed by the CMP. The non-planar surface feature 68 which resulted from the conformal deposition of the BPSG over the metal pattern 54 is also removed.

After polishing, the residual SOG is removed from the opening 60 by dipping the wafer into 20:1 dilute HF for about 20 seconds. The insulating layer 56 is at its final design thickness and the opening 60 is un-obstructed.

Figure 4C:
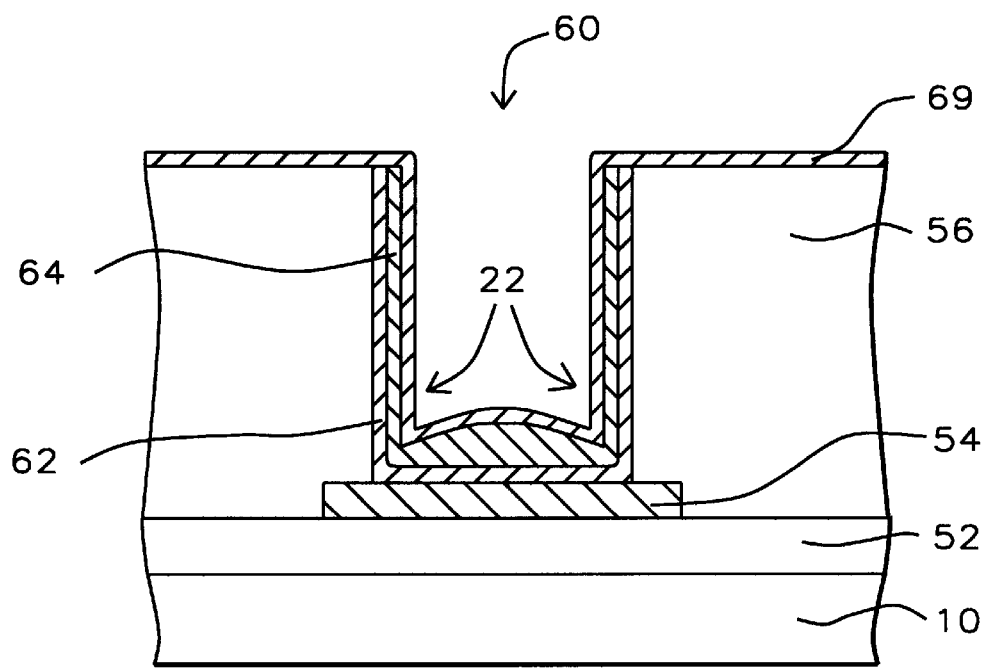

Referring next to FIG. 4C, a Ti/TiN barrier/glue layer 69 is next deposited over the wafer by sputtering. This layer forms an additional coating within the opening 60 and re-enforces the lower corners 22 of the opening 60 thereby reducing risk of adhesion or barrier failure.

Figure 4D:
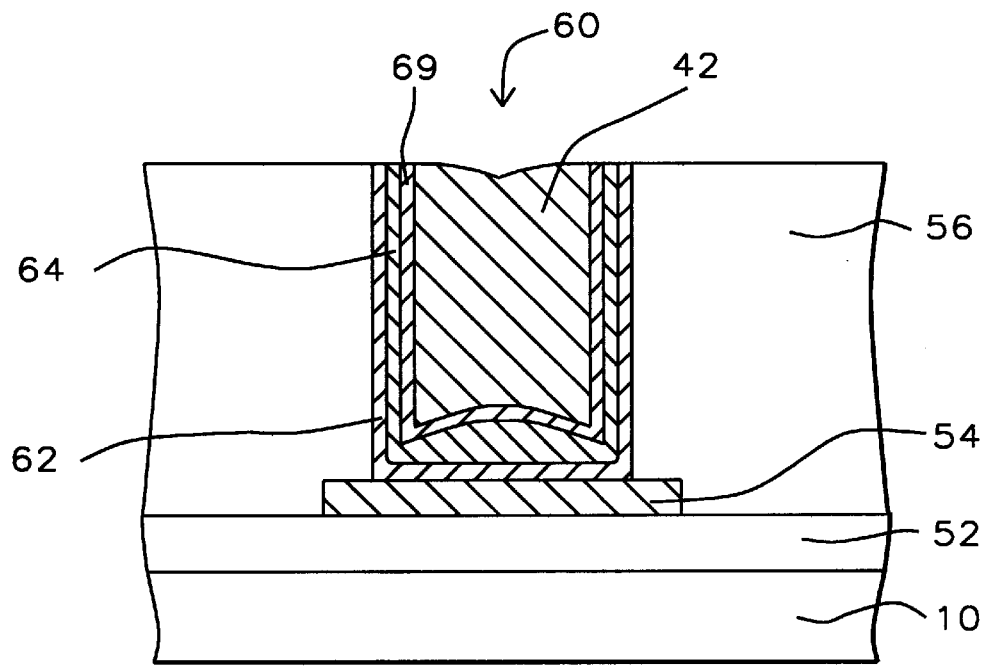

Referring now to FIG. 4D, a tungsten plug 42 is formed in the via opening 60 in the same manner as in the first embodiment. Because the walls of the via opening 60 have been rendered essentially vertical by the removal of the cusps, the tungsten deposition fills the via opening 60 without leaving voids. The tungsten plug is subsequently contacted by the preferred interconnection metallurgy, which typically consists of an aluminum alloy, deposited and patterned on the surface of the insulating layer.

In a third embodiment, where aluminum or an aluminum alloy is to be used for filling vias, all the steps of the second embodiment are followed except that after the residual SOG has been removed from the opening 60 with dilute HF, a glue layer is comprised solely of Ti and is deposited immediately prior to the MOCVD deposition of the aluminum or aluminum alloy.

In a fourth embodiment, infra, a method for forming vias of different depths is described. The CMP step in this embodiment performs both surface planarization as well as barrier/glue layer cusp removal within the via openings. This is done by forming the via openings and depositing the barrier/glue layer before the CMP step. In this way both shallow and deep vias may be formed without requiring over-etching of the shallow vias in order to open the deeper ones—a problem encountered when the vias are opened after the CMP planarization step.

Figure 5A:
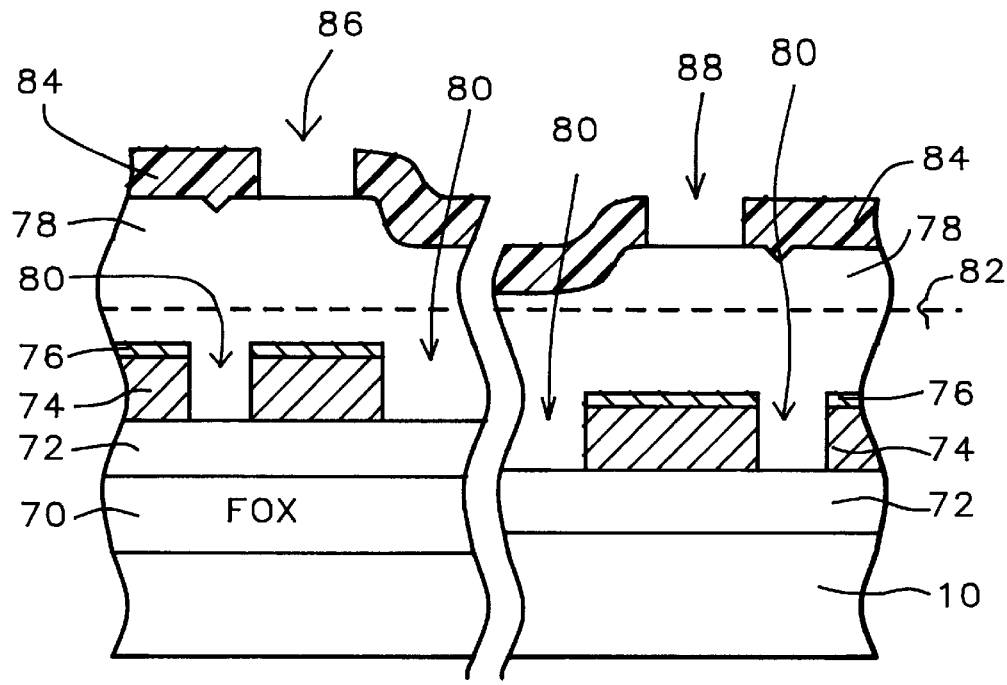
FIG. 5A through FIG. 5E are cross sections illustrating a third embodiment of this invention.

Referring to FIG. 5A, there is shown a cross section of a silicon wafer substrate 10 with semiconductor devices formed within its surface. The layer 72 represents a plurality of structural components layered beneath a metal pattern 74. These comprise polysilicon levels which form components of MOS field-effect-transistors and their local interconnects.

The figure illustrates two regions of interest on the wafer. In the left hand portion, the metal pattern 74 lies over a region containing field oxide (FOX) 70 while in the right hand portion, the FOX layer is absent. The spaces 80 represents the patterning of the metal pattern 74. Atop the metal pattern 74 is an anti-reflective-coating (ARC) 76. This coating serves to eliminate reflections from the metal surface during exposure of the patterning photoresist.

An insulative IMD layer of BPSG 78 is deposited over the patterned metal layer 74. This layer is deposited thicker than required to accommodate the material which must be removed for both the planarization and the cusp removal. The dashed line 82 indicates the final design thickness of the IMD layer.

Photoresist 84 is applied and patterned to define the shallow via 86 and the deep via 88. The vias are then formed by anisotropic etching, for example by RIE. By etching the vias at this juncture, rather than after CMP planarization, both deep and shallow vias have essentially the same thickness of the insulative layer 78. Consequently the shallow via 86 need not be over-etched in order to open the deep via 88 during the anisotropic etching step. Over-etching can cause serious damage to the shallow via.

Figure 5B:
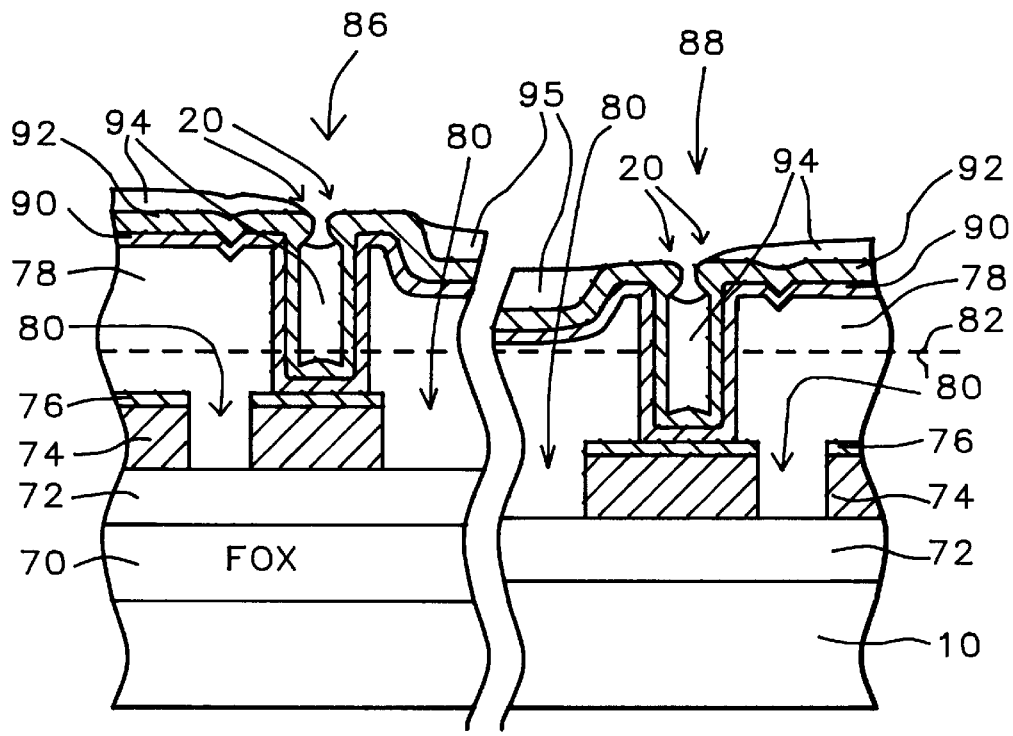

Referring next to FIG. 5B, the photoresist is removed and, a layer of Ti 90 between 400 and 800 Angstroms thick and a layer of TiW 92 between 1,500 and 2,500 Angstroms thick are deposited over the wafer by sputtering. The two layers are deposited sequentially, without breaking vacuum, in a multi-target sputtering tool having a Ti target and a TiW target utilizing argon. Cusps 20 develop at the mouths of the via openings 86 and 88.

Spin-on-glass (SOG) 94, is applied using a commercial wafer spinning apparatus with an adjustable spin rate and a dispensing nozzle located above the wafer center. The application procedure consists of applying the SOG solution at a pre-determined spin rate; removing the wafer and placing it to bake successively on three hot plates set at 100° C., 160° C. and 250° C. for about one minute on each. This procedure gradually drives out the solvent and performs a partial curing. A single coat consisting of about 4,000 to 6,000 Angstroms of SOG is applied.

As is illustrated in FIG. 5B, The SOG 94 fills in the via openings 86 and 88 equally to a level which is above the dashed line 62 which represents the final design thickness of the insulating layer 78 and above the bases of the cusps 20. Thicker SOG may also reside in contoured areas 95. The SOG provides protection of the via openings 86 and 88 and their metal lining from damage and contamination during subsequent CMP processing.

Next the wafer undergoes CMP which removes material from the surface of the wafer above the dashed line 62. This procedure not only planarizes the wafer surface but also removes cusps 20 which encroach into the via openings 86 and 88. Determination of endpoint for the CMP may be accomplished by monitoring the thickness of the insulating layer 78 during polishing although, by proper calibration, a timed CMP can achieve the target thickness to an acceptable measure. After polishing, the residual SOG is removed by dipping the wafer into 20:1 dilute HF for about 20 seconds.

Figure 5C:
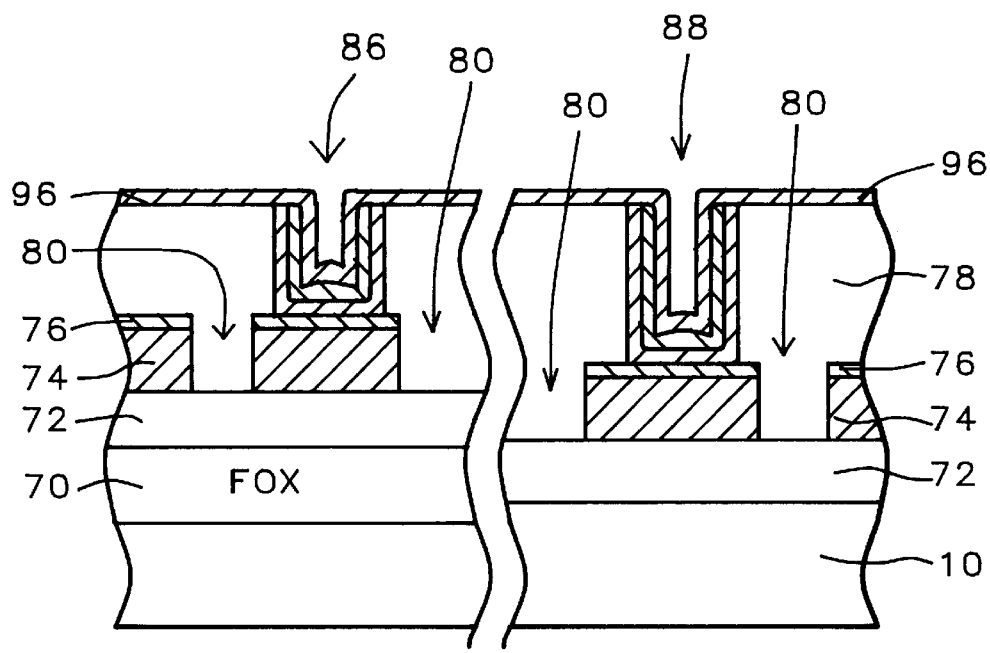
Figure 5D:
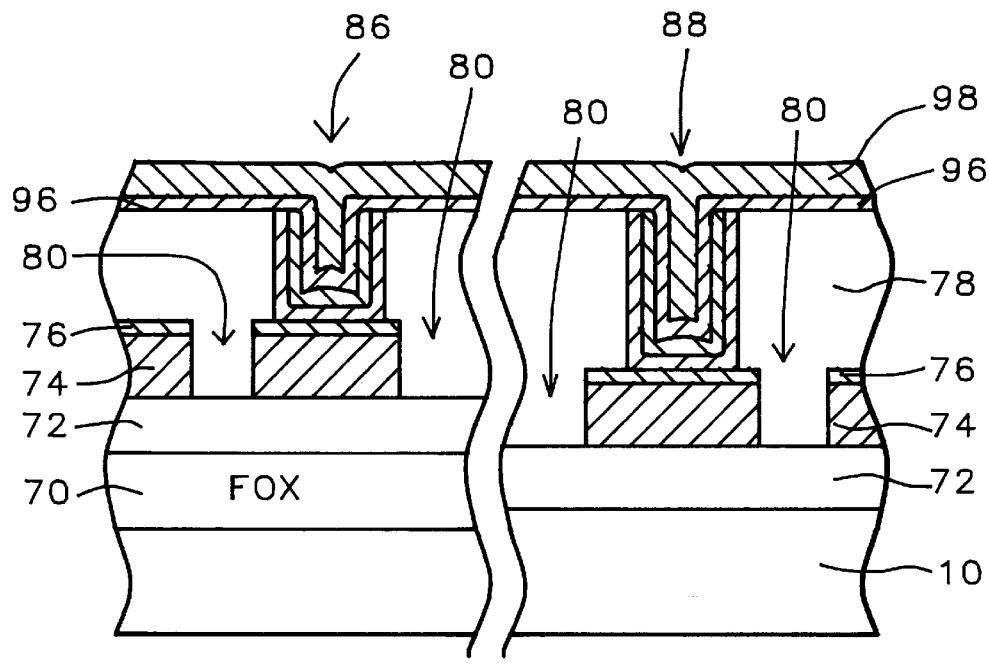
Figure 5E:
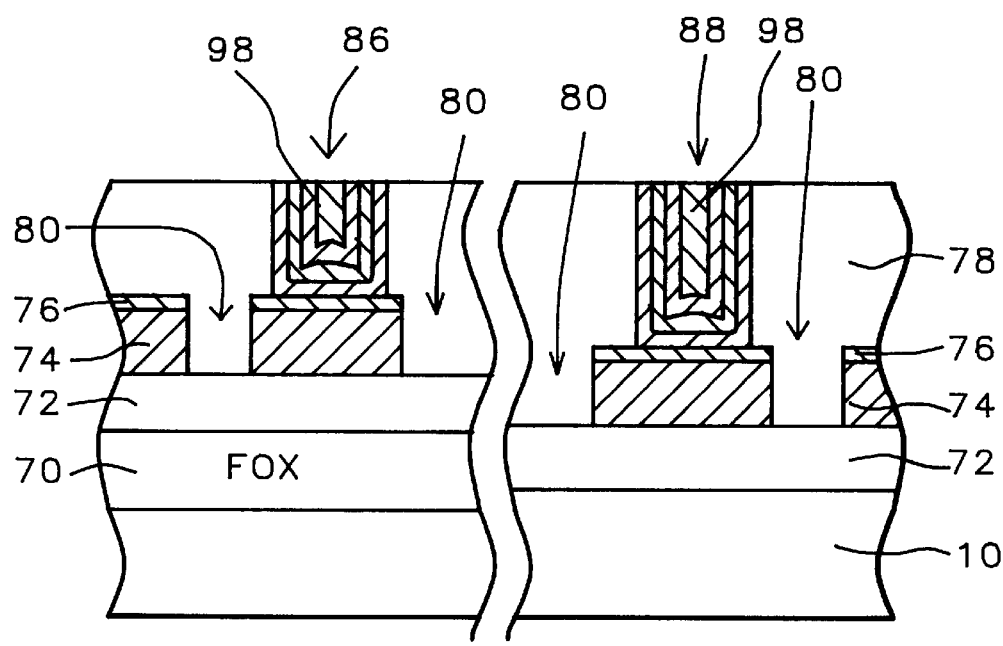

Referring next to FIG. 5C, a Ti barrier/glue layer 96 is deposited over the wafer by sputtering. In FIG. 5C, there are shown tungsten plugs 98 formed in the via openings in the same manner as in the first embodiment. Because the walls of the via opening 60 have been rendered essentially vertical by the removal of the cusps, the tungsten plugs 98 are without voids.

As in the third embodiment if the vias are to be filled with aluminum or an aluminum alloy, all the steps of the fourth embodiment are followed except that after the residual SOG has been removed from the opening 60 with dilute HF, a glue layer is comprised solely of Ti and is deposited immediately prior to the MOCVD deposition of the aluminum or aluminum alloy.

The embodiments of this invention use a p-type silicon substrate. It should be well understood by those skilled in the art that other type substrates may also be used. It should be further understood that the substrate conductivity type as referred to here does not necessarily refer to the conductivity of the starting wafer but could also be the conductivity of a diffused region within a wafer wherein the semiconductor devices are incorporated. Such situations encountered in the twin-well CMOS technology.

While the invention has been particularly shown and described with reference to the preferred embodiments thereof, it will be understood by those skilled in the art that various changes in form and details may be made without departing from the spirit and scope of the invention.

What is claimed is:

1. A method of improving step coverage of material deposited by a PVD technique in vertical walled openings in an insulative layer, said vertical walled openings having an aspect ratio greater than one, comprising:

providing a substrate having an insulative layer formed over its surface;

forming vertical walled openings with aspect ratios greater than one through said insulative layer;

depositing a first layer onto said substrate;

depositing a second layer onto said substrate by a PVD technique whereby cusps are formed at the mouths of said vertical walled openings;

depositing a spin-on-glass (SOG) over said substrate, whereby said SOG fills said vertical walled openings to above the lower portion of said cusps;

partially curing said SOG;

subjecting said substrate chemical-mechanical-polishing, until said SOG has been penetrated and said cusps are removed;

removing said SOG; and depositing a third layer onto said substrate. group consisting of rf sputtering, rf magnetron sputtering, dc sputtering, dc magnetron sputtering and vacuum evaporation.

2. The method of claim 1 wherein said PVD technique is selected from the group consisting of rf sputtering, rf magnetron sputtering, dc sputtering, dc magnetron sputtering and vacuum evaporation.

3. The method of claim 1 wherein said insulative layer is between about 1.0 and 1.5 microns thick.

4. The method of claim 1 wherein said insulative layer is selected from the group consisting of silicon oxide, phosphosilicate glass, and borophosphosilicate glass.

5. The method of claim 1 wherein said first layer is selected from the group consisting of Ti and Pt and is between about 400 and 800 Angstroms thick.

6. The method of claim 1 wherein said second layer is selected from the group consisting of TiN and TiW and is between about 1,500 and 2,500 Angstroms thick.

7. The method of claim 1 wherein said SOG is selected from the group consisting of a siloxane and a silicate.

8. The method of claim 1 wherein said third layer is selected from the group consisting of Ti, Ti/TiN and Ti/TiW and is between about 400 and 800 Angstroms thick.

9. A method for forming metal contacts to active areas of integrated circuit devices formed within the surface of a semiconductor wafer comprising:

provuding a semiconductor wafer having integrated circuit semiconductor devices formed within its surface and having an insulative layer over said semiconductor devices with vertical walled openings patterned and etched in said insulative layer, exposing subjacent contact regions of said semiconductor devices;

depositing a refractory metal over said insulative layer;

depositing a barrier material over said refractory metal by a PVD technique whereby cusps of are formed at the mouths of said vertical walled openings;

depositing a spin-on-glass (SOG) over said semiconductor wafer, whereby said SOG fills said vertical walled openings to above a lower portion of said cusps;

partially curing said SOG;

subjecting said semiconductor wafer to chemical-mechanical-polishing, until said SOG has been penetrated and said cusps are removed;

removing said SOG;

depositing a glue layer on said semiconductor wafer;

depositing a metal layer over said glue layer; and etching said metal layer with a unidirectional dry etching technique to form metal plugs.

10. The method of claim 9 wherein said PVD technique is selected from the group consisting of rf sputtering, rf magnetron sputtering, dc sputtering, dc magnetron sputtering and vacuum evaporation.

11. The method of claim 9 wherein said insulative layer is between about 1.0 and 1.5 microns thick.

12. The method of claim 9 wherein said insulative layer is selected from the group consisting of silicon oxide, phosphosilicate glass, and borophosphosilicate glass.

13. The method of claim 9 wherein said refractory metal is selected from the group consisting of Ti and Pt, and is between about 400 and 800 Angstroms thick.

14. The method of claim 9 wherein said barrier material is selected from the group consisting of TiN and TiW, and is between about 1,500 and 2,500 Angstroms thick.

15. The method of claim 9 wherein said SOG is selected from the group consisting of a siloxane and a silicate.

16. The method of claim 9 wherein said glue layer is selected from the group consisting of Ti/TiN, and Ti/TiW.

17. The method of claim 16 further comprising subjecting said semiconductor wafer to a rapid thermal anneal after said glue layer is deposited.

18. The method of claim 12 wherein said metal layer is tungsten deposited at a temperature between about 440° C. and 480° C. in a cold walled, low temperature CVD system by the reduction of $WF_6$ with $H_2$.

19. The method of claim 18 wherein said metal layer is between about 3,000 and 5,000 Angstroms thick.

20. The method of claim 9 wherein said glue layer is Ti.

21. The method of claim 20 further comprising subjecting said semiconductor wafer to a rapid thermal anneal before said glue layer is deposited and after said SOG is removed.

22. The method of claim 21 wherein said metal layer is aluminum or an aluminum alloy.

23. A method for forming vias between levels of wiring metallization of integrated circuit devices formed in a semiconductor wafer comprising:

providing a semiconductor wafer having integrated circuit semiconductor devices formed within its surface and having at least one level of wiring metallization connected to said semiconductor devices;

depositing an insulative layer over said wiring metallization;

depositing a photoresist layer over said insulative layer;

patterning said photoresist layer to define vias;

etching said vias using reactive-ion-etching to produce vertical walled openings exposing subjacent wiring metallization;

removing said photoresist layer;

depositing a refractory metal over said insulative layer;

depositing a barrier material over said refractory metal by a PVD technique whereby cusps of are formed at the mouths of said vertical walled openings;

depositing a spin-on-glass (SOG) on said semiconductor wafer, whereby said SOG glass fills said vertical walled openings to above the lower portion of said cusps;

partially curing said SOG;

subjecting said semiconductor wafer to chemical-mechanical-polishing, until said SOG has been penetrated and said cusps are removed;

removing said SOG;

depositing a glue layer on said semiconductor wafer;

depositing a metal layer over said glue layer; and etching said metal layer with a unidirectional dry etching technique to form metal plugs.

24. The method of claim 23 wherein said PVD technique is selected from the group consisting of rf sputtering, rf magnetron sputtering, dc sputtering, dc magnetron sputtering and vacuum evaporation.

25. The method of claim 23 wherein said insulative layer is between about 1.0 and 1.5 microns thick.

26. The method of claim 23 wherein said insulative layer is selected from the group consisting of silicon oxide, phosphosilicate glass, and borophosphosilicate glass.

27. The method of claim 23 wherein said refractory metal is selected from the group consisting of Ti and Pt, and is between about 400 and 800 Angstroms thick.

28. The method of claim 23 wherein said barrier material is selected from the group consisting of TiN and TiW, and is between about 1,500 and 2,500 Angstroms thick.

29. The method of claim 23 wherein said SOG is selected from the group consisting of a siloxane and a silicate.

30. The method of claim 23 wherein said glue layer is selected from the group consisting of Ti/TiN, and Ti/TiW.

31. The method of claim 30 wherein said metal layer is tungsten deposited at a temperature between about 440° C. and 480° C. in a cold walled, low temperature CVD system by the reduction of $WF_6$ with $H_2$.

32. The method of claim 31 wherein said metal layer is between about 3,000 and 5,000 Angstroms thick.

33. The method of claim 23 wherein said glue layer is Ti.

34. The method of claim 33 wherein said metal layer is aluminum or an aluminum alloy.

* * * * *